US009412778B2

(12) United States Patent
Ishino

(10) Patent No.: US 9,412,778 B2
(45) Date of Patent: Aug. 9, 2016

(54) SEMICONDUCTOR DEVICE, SOLID-STATE IMAGE SENSOR, METHODS OF MANUFACTURING THE SAME, AND CAMERA

(71) Applicant: CANON KABUSHIKI KAISHA, Tokyo (JP)

(72) Inventor: Hideaki Ishino, Fujisawa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/684,634

(22) Filed: Apr. 13, 2015

(65) Prior Publication Data

US 2015/0303227 A1 Oct. 22, 2015

(30) Foreign Application Priority Data

Apr. 21, 2014 (JP) ................................. 2014-087593

(51) Int. Cl.
*H01L 27/14* (2006.01)
*H01L 27/146* (2006.01)
*H01L 21/00* (2006.01)

(52) U.S. Cl.
CPC ...... *H01L 27/14636* (2013.01); *H01L 27/1463* (2013.01); *H01L 27/14603* (2013.01); *H01L 27/14612* (2013.01); *H01L 27/14623* (2013.01); *H01L 27/14627* (2013.01); *H01L 27/14629* (2013.01); *H01L 27/14641* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 6,025,267 | A | * | 2/2000 | Pey | ................... | H01L 21/28518 257/E21.165 |
|---|---|---|---|---|---|---|
| 6,794,215 | B2 | | 9/2004 | Park et al. | | |
| 7,235,835 | B2 | * | 6/2007 | Nagano | ............ | H01L 21/82385 257/296 |
| 7,391,453 | B2 | | 6/2008 | Ohkawa | | |
| 8,030,653 | B2 | | 10/2011 | Kim | | |
| 8,298,851 | B2 | * | 10/2012 | Tatani | ................. | H01L 27/1462 257/290 |
| 8,390,043 | B2 | | 3/2013 | Tatani | | |
| 8,987,852 | B2 | | 3/2015 | Okabe et al. | | |
| 2001/0025970 | A1 | * | 10/2001 | Nozaki | ............ | H01L 27/14609 257/255 |
| 2002/0094697 | A1 | * | 7/2002 | Leung | ................... | G11C 5/147 438/766 |
| 2004/0094784 | A1 | * | 5/2004 | Rhodes | ............ | H01L 27/14609 257/291 |
| 2006/0125007 | A1 | * | 6/2006 | Rhodes | ............ | H01L 21/76895 257/346 |
| 2012/0199893 | A1 | * | 8/2012 | Okabe | ............... | H01L 27/14641 257/291 |

(Continued)

FOREIGN PATENT DOCUMENTS

JP 2001-267547 A 9/2001
JP 2004-095966 A 3/2004

(Continued)

OTHER PUBLICATIONS

P.J. Chen et al., "Deuterium Transport Through Device Structures," 86(4) J. Appl. Phys. 2237-2244 (Aug. 1999).

*Primary Examiner* — Evren Seven
(74) *Attorney, Agent, or Firm* — Fitzpatrick, Cella, Harper & Scinto

(57) ABSTRACT

A method of manufacturing a semiconductor device includes forming a silicon compound layer containing nitrogen on a substrate where a silicide layer and an element isolating portion have been formed, forming an opening in the silicon compound layer, and forming an interlayer insulating film which covers the silicon compound layer and the opening. The opening is formed to lie within an area of the silicon compound layer that overlaps the element isolating portion.

20 Claims, 15 Drawing Sheets

(56) References Cited

U.S. PATENT DOCUMENTS

2013/0181307 A1* 7/2013 Ohta .................. H01L 31/1136
                                                              257/431
2015/0179700 A1   6/2015 Okabe et al.
2015/0303230 A1* 10/2015 Kamino .............. H01L 27/1461
                                                              257/443

FOREIGN PATENT DOCUMENTS

| | | |
|---|---|---|
| JP | 2004-134684 A | 4/2004 |
| JP | 2009-147318 A | 7/2009 |
| JP | 2009-266843 A | 11/2009 |
| JP | 2012-182426 A | 9/2012 |

* cited by examiner

FIG. 5
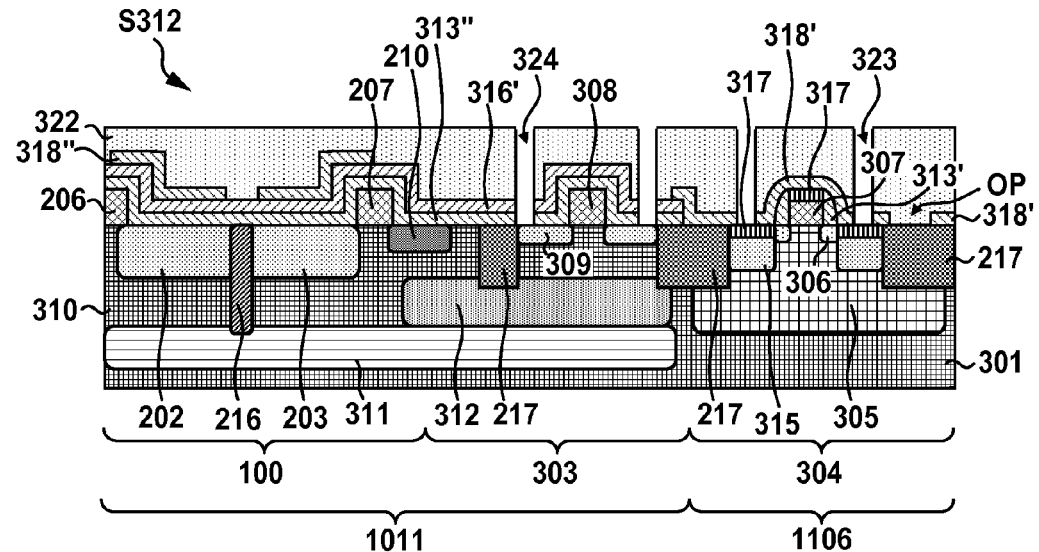
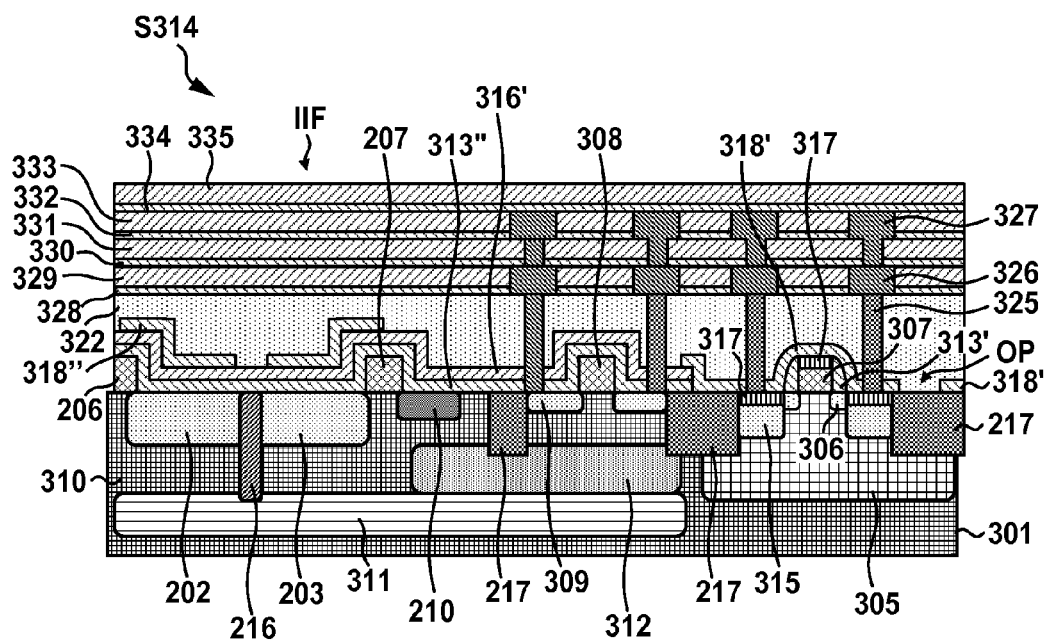

FIG. 7
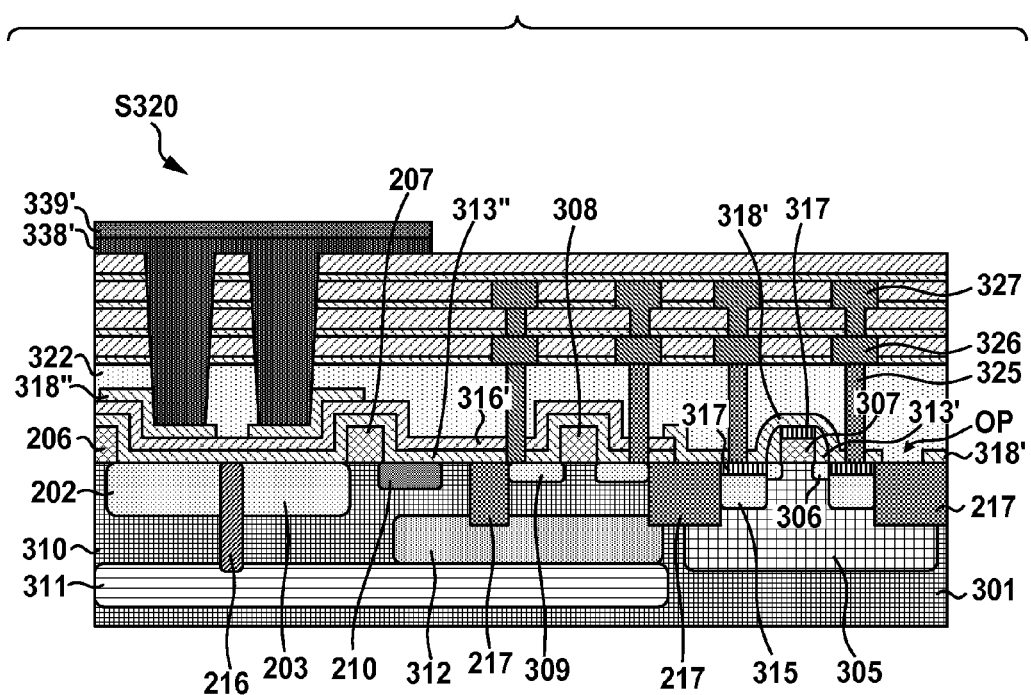
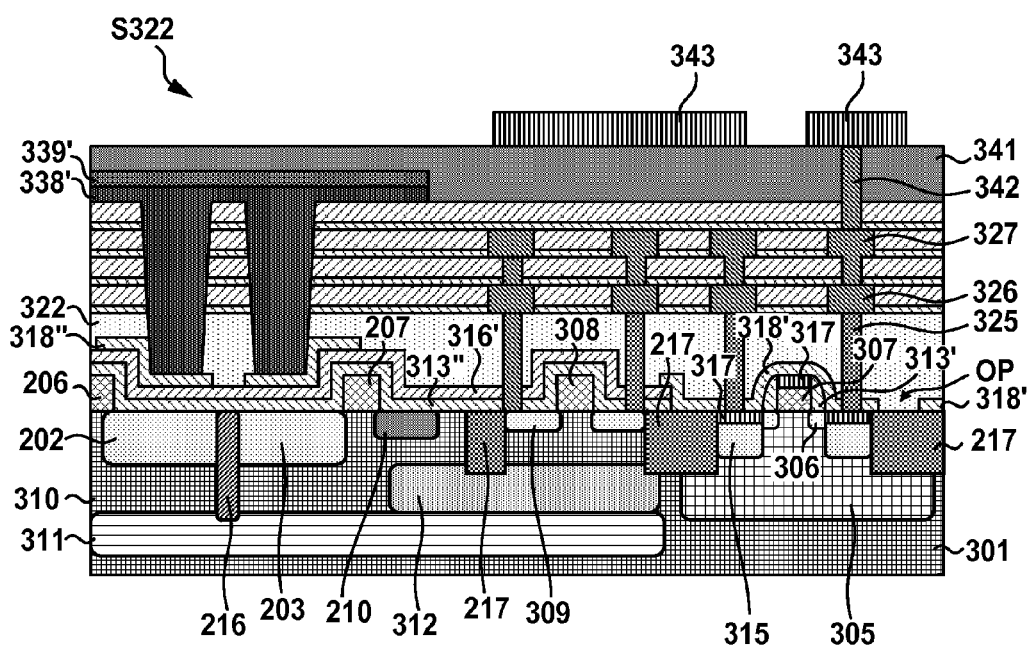

F I G. 11
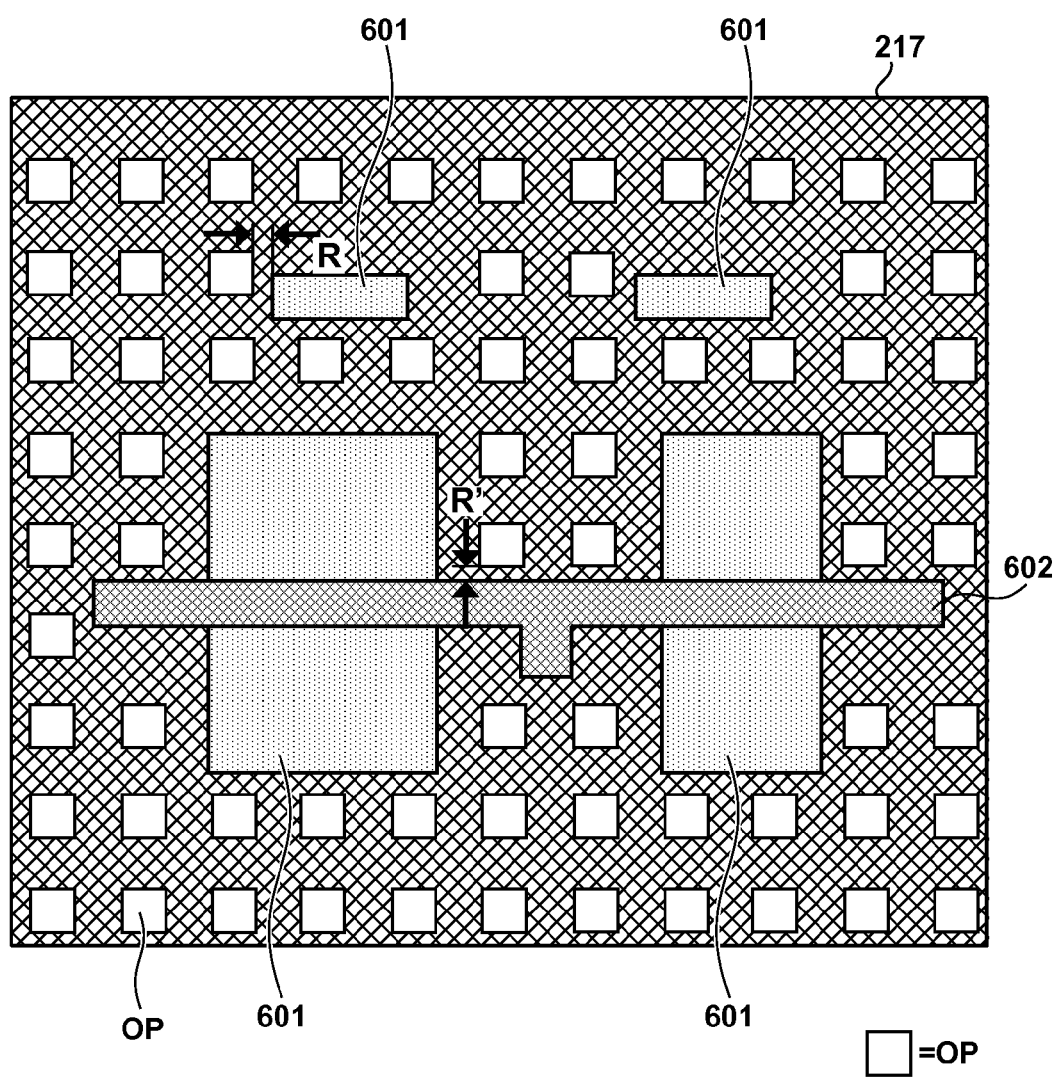

F I G. 13
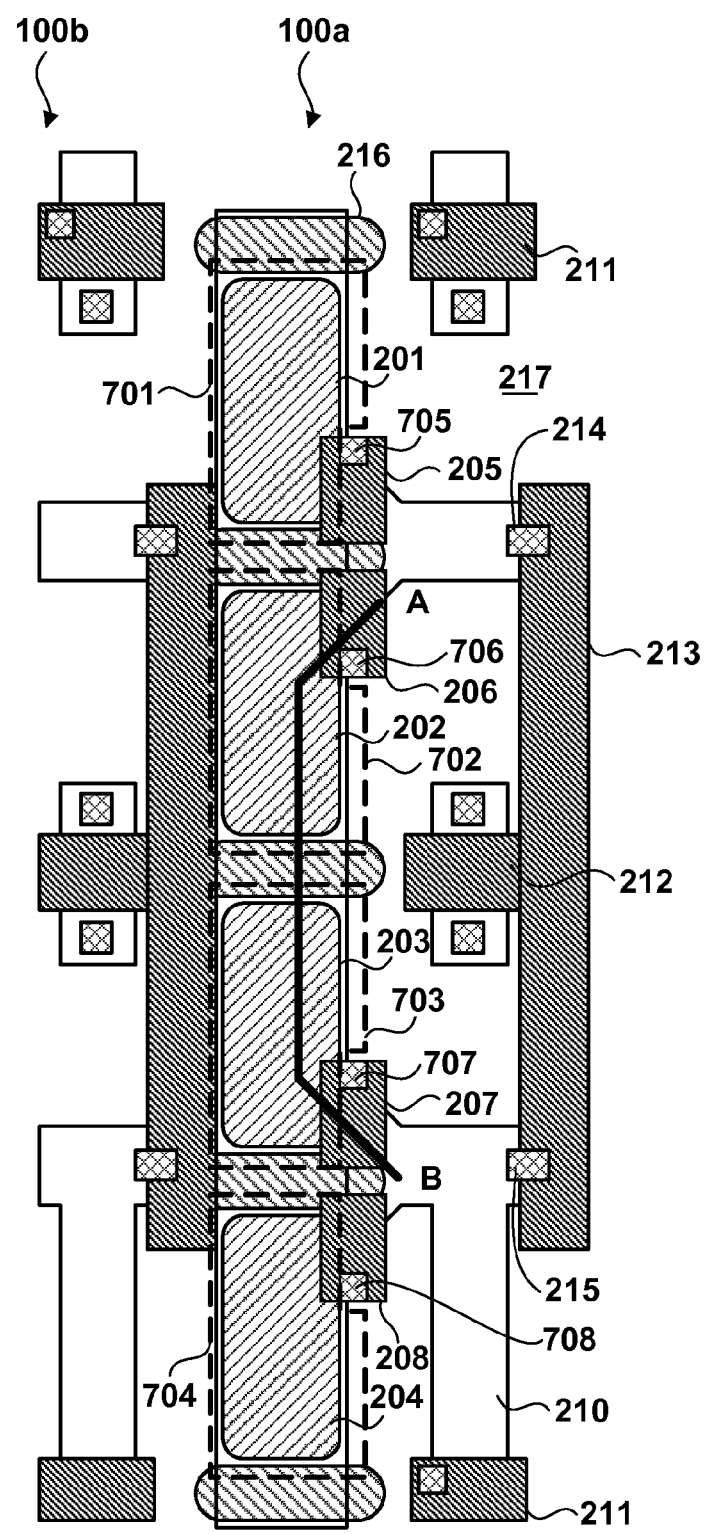

F I G. 15
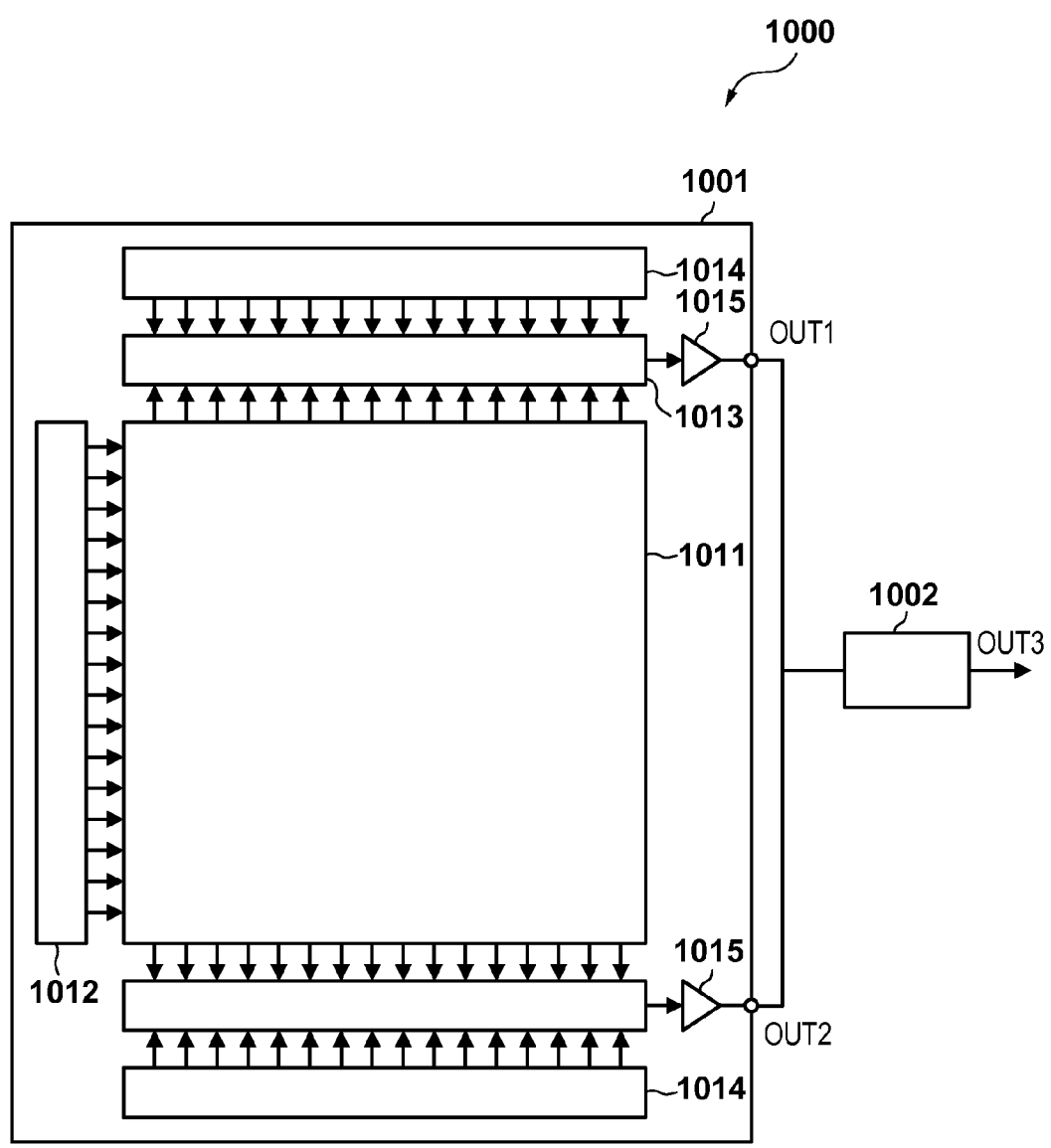

SEMICONDUCTOR DEVICE, SOLID-STATE IMAGE SENSOR, METHODS OF MANUFACTURING THE SAME, AND CAMERA

BACKGROUND OF THE INVENTION

1. Field of the Invention

The present invention relates to a semiconductor device, a solid-state image sensor, methods of manufacturing the same, and a camera.

2. Description of the Related Art

There is available a method of forming an interlayer insulating film on an etching stopper and then forming a contact hole in the interlayer insulating film so as to stop etching at the etching stopper. In this method, the etching stopper is etched so as to penetrate the etching stopper exposed at the bottom of the contact hole after forming an opening in the interlayer insulating film.

Japanese Patent Laid-Open No. 2012-182426 describes a method of, after forming a silicide layer in a transistor, forming an insulating film including a silicon nitride film, forming an interlayer insulating film made of silicon oxide on that, and then forming a contact hole in the insulating film and the interlayer insulating film.

A general silicon nitride layer has low hydrogen permeability when it undergoes an insufficient annealing process. According to "Journal of Applied Physics, V86, pp 2237-Duterium transport through device structures, P. J Chen and R. M. Wallace", the permeability of the silicon nitride layer increases by undergoing an annealing process at a temperature of 900° C. or higher.

As in the example described in Japanese Patent Laid-Open No. 2012-182426, when forming the silicide layer in the transistor, a processing temperature after forming the silicide layer is restricted from the viewpoint of protecting the silicide layer. For example, when the silicide layer is formed by a cobalt silicide, the upper limit for the processing temperature is about 850° C. Since the silicon nitride layer used as an etching stopper for forming the contact hole is formed after a silicidation step, it is not desirable to perform the annealing process on the silicon nitride layer at the temperature of 900° C. or higher. For this reason, the silicon nitride layer is maintained at low hydrogen permeability. When the hydrogen permeability of the silicon nitride layer is low, the supply of hydrogen to the transistor is restricted by the silicon nitride layer. Therefore, the termination rate of a dangling bond is decreased, resulting in degradation in transistor characteristics such as a subthreshold characteristic and mobility.

In a current solid-state image sensor, the speedup of a peripheral circuit becomes more important as the number of pixels increases. Therefore, a process which degrades the subthreshold characteristic, mobility, and the like closely related to the speedup should be avoided.

SUMMARY OF THE INVENTION

The present technology provides a semiconductor device advantageous in increasing the speed of an operation and a method of manufacturing the same.

One of aspects of the disclosed embodiments provides a method of manufacturing a semiconductor device, the method comprising steps of: forming a silicon compound layer containing nitrogen on a substrate where a silicide layer and an element isolating portion have been formed; forming an opening in the silicon compound layer; and forming an interlayer insulating film which covers the silicon compound layer and the opening, wherein the opening is formed to lie within an area of the silicon compound layer that overlaps the element isolating portion.

Further features of the present invention will become apparent from the following description of exemplary embodiments with reference to the attached drawings.

BRIEF DESCRIPTION OF THE DRAWINGS

FIG. 5 shows views for exemplarily explaining the method of manufacturing the solid-state image sensor as one example of the semiconductor device;

FIG. 7 shows views for exemplarily explaining the method of manufacturing the solid-state image sensor as one example of the semiconductor device;

FIG. 11 is a view showing the second preferable arrangement example of the openings in the peripheral circuit portion;

FIG. 13 is a view exemplifying insulating films used as etching stoppers when forming a waveguide in a pixel portion;

FIG. 15 is a view illustrating the arrangement of a camera including the solid-state image sensor and a processor.

DESCRIPTION OF THE EMBODIMENTS

The present invention will be described below with reference to the accompanying drawings by way of an exemplary embodiment.

The present invention can be applied to any semiconductor device unless otherwise specified explicitly. The concept of the semiconductor device can include, for example, a solid-state image sensor, a signal processing device, a memory device, and a logical operation device. The concept of the solid-state image sensor can include a MOS image sensor and a CCD image sensor.

Figure 1:
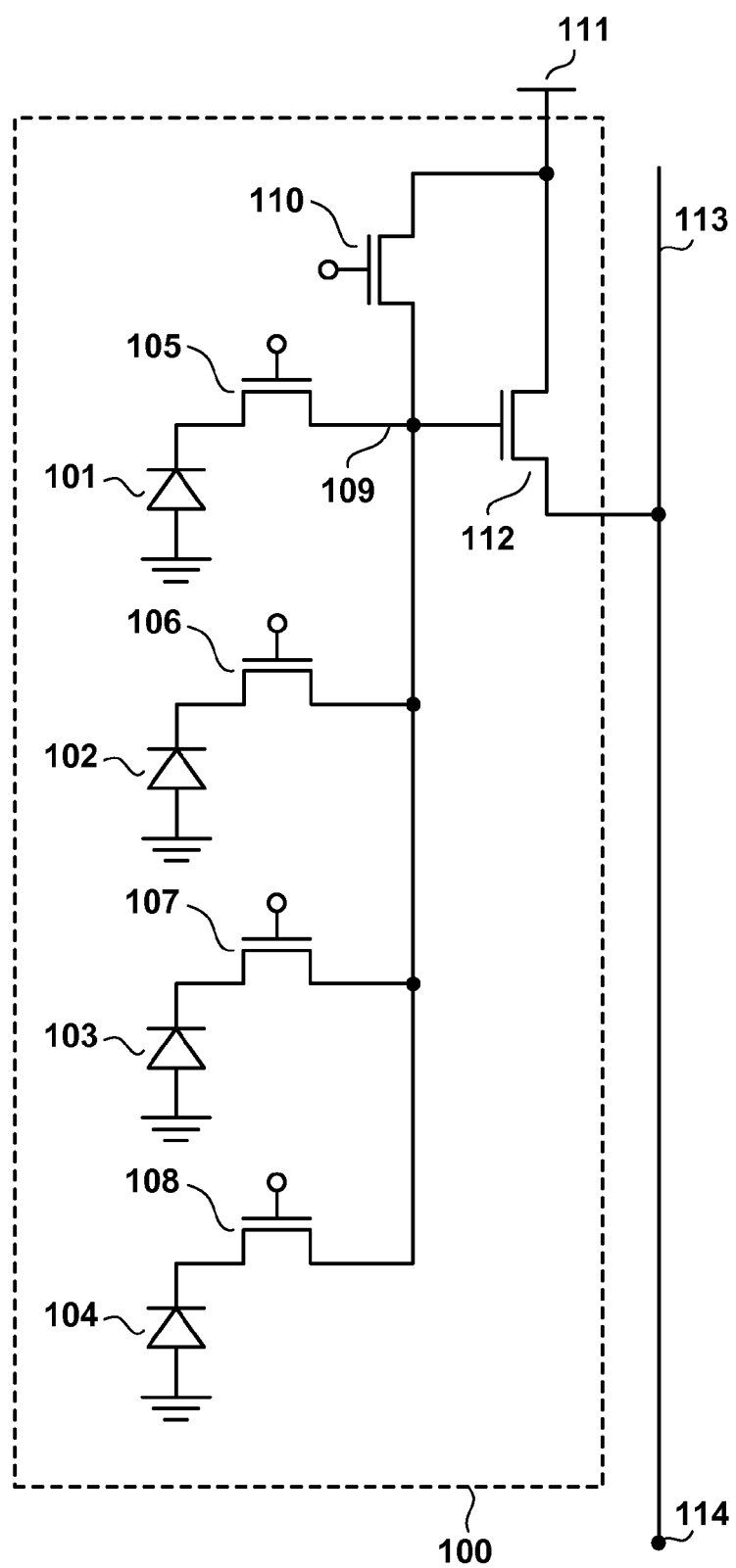
FIG. 1 is a circuit diagram showing a pixel cell in a solid-state image sensor as one application example of a semiconductor device.

FIG. 1 shows a circuit diagram of a pixel cell in the solid-state image sensor as one application example of the semiconductor device. A pixel cell 100 can include a plurality of photoelectric converters (for example, photodiodes or photogates) 101 to 104, a plurality of transfer transistors 105 to 108, one reset transistor 110, and one amplifier transistor 112. The pixel cell 100 can also include a charge-voltage converter 109. The charge-voltage converter 109 can include a floating diffusion node. In the example shown in FIG. 1, a signal corresponding to the amount of electrons out of holes and electrons generated by photoelectric conversion is read out, and each of the transistors 105, 110, and 112 is formed by an NMOS transistor.

In the example shown in FIG. 1, the photodiode which forms each of the photoelectric converters 101 to 104 has the anode connected to ground and accumulates charges (electrons) generated in accordance with the amount of incident light. The transfer transistors 105 to 108 transfer the charges accumulated in the corresponding photoelectric converters 101 to 104 to the charge-voltage converter 109. More specifically, the first photoelectric converter 101 and the source of the first transfer transistor 105 are connected to each other, and the second photoelectric converter 102 and the sources of the second transfer transistor 106 are connected to each other. Also, the third photoelectric converter 103 and the source of the third transfer transistor 107 are connected to each other, and the fourth photoelectric converter 104 and the source of the fourth transfer transistor 108 are connected to each other. The drains of the first to fourth transfer transistors 105 to 108 are connected to the common charge-voltage converter 109. As for the amplifier transistor 112, the gate electrode is connected to the charge-voltage converter 109, the drain is connected to a power supply line 111, and the source is connected to an output signal line 113. A signal corresponding to the potential of the charge-voltage converter 109 is output to the output signal line 113.

The reset transistor 110 resets the potential of the charge-voltage converter 109 to the reset potential. The power supply line 111 is controlled by at least two potentials and can set the pixel cell 100 to a selected state or an unselected state by resetting the potential of the charge-voltage converter 109 to either of two values. A selection transistor may set the pixel cell 100 to the selected state or the unselected state. The plurality of pixel cells 100 are connected to the output signal line 113. A terminal 114 of the output signal line 113 is connected to a readout circuit to be described later.

FIG. 15 exemplarily shows the arrangement of a camera 1000 including a solid-state image sensor 1001 and a processor 1002. The concept of the camera includes not only an apparatus mainly aiming at image capturing but also an apparatus (for example, a personal computer or a portable terminal) accessorily having an image capturing function. The solid-state image sensor 1001 includes a pixel portion 1011, a vertical scanning circuit 1012, two readout circuits 1013, two horizontal scanning circuits 1014, and two output amplifiers 1015. An aggregate of the elements other than the pixel portion 1011 out of the elements which form the solid-state image sensor 1001 will be referred to as a peripheral circuit portion 1106.

The pixel portion 1011 can be formed by, for example, two-dimensionally arraying the plurality of pixel cells 100 illustrated in FIG. 1. That is, the pixel portion 1011 is formed by the array of the plurality of pixels. Each pixel cell 100 includes one or the plurality of pixels. Each readout circuit 1013 includes, for example, a column amplifier, a CDS circuit, or an addition circuit and processes (for example, amplifies or adds) a signal read out from the pixel on a row selected by the vertical scanning circuit 1012 via the output signal line 113. Each horizontal scanning circuit 1014 generates a signal for sequentially selecting signals read out by the readout circuits 1013. Each output amplifier 1015 amplifies and outputs the signal selected by each horizontal scanning circuit 1014.

Figure 2:
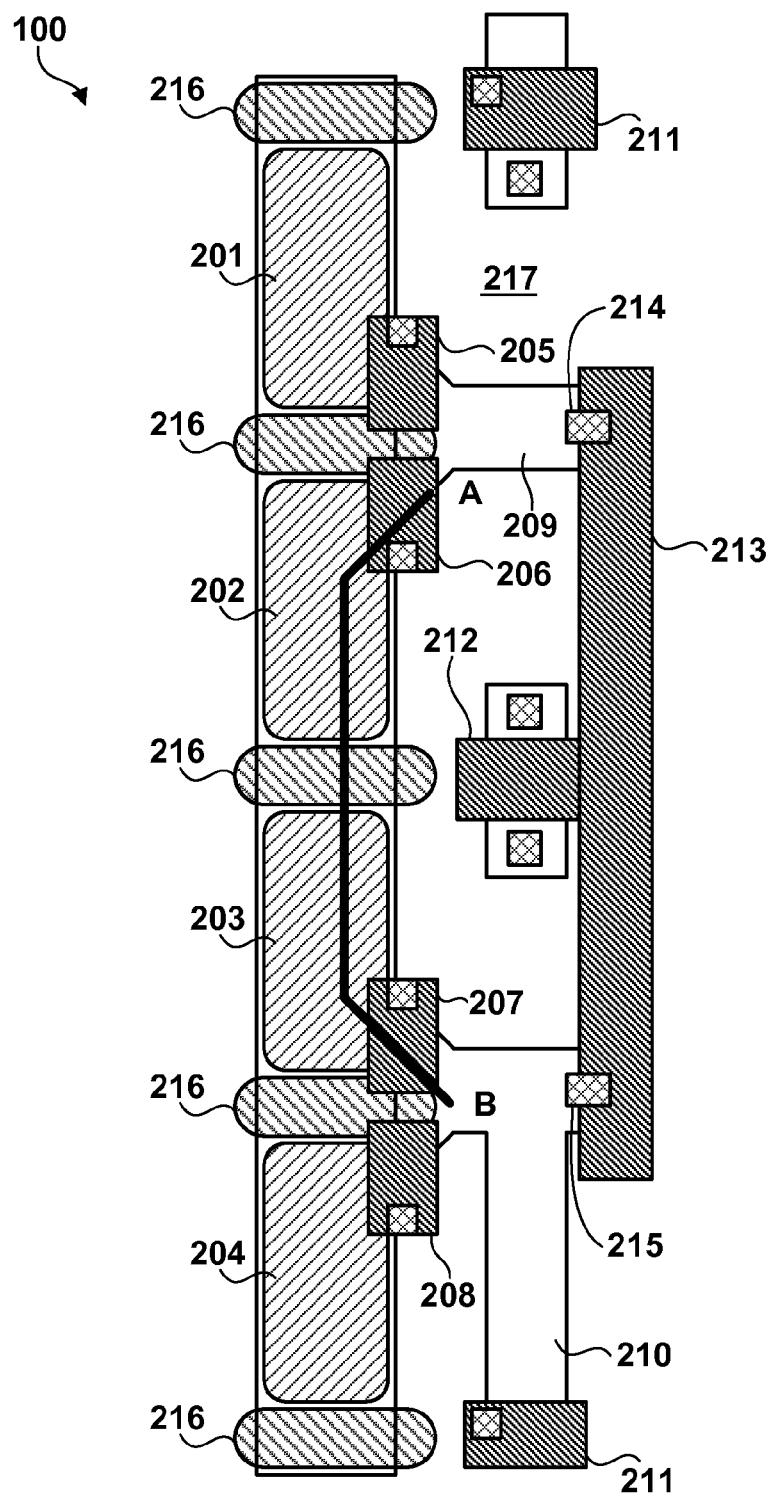
FIG. 2 is a view exemplifying the two-dimensional layout (plan view) of a unit pixel.
Figure 3:
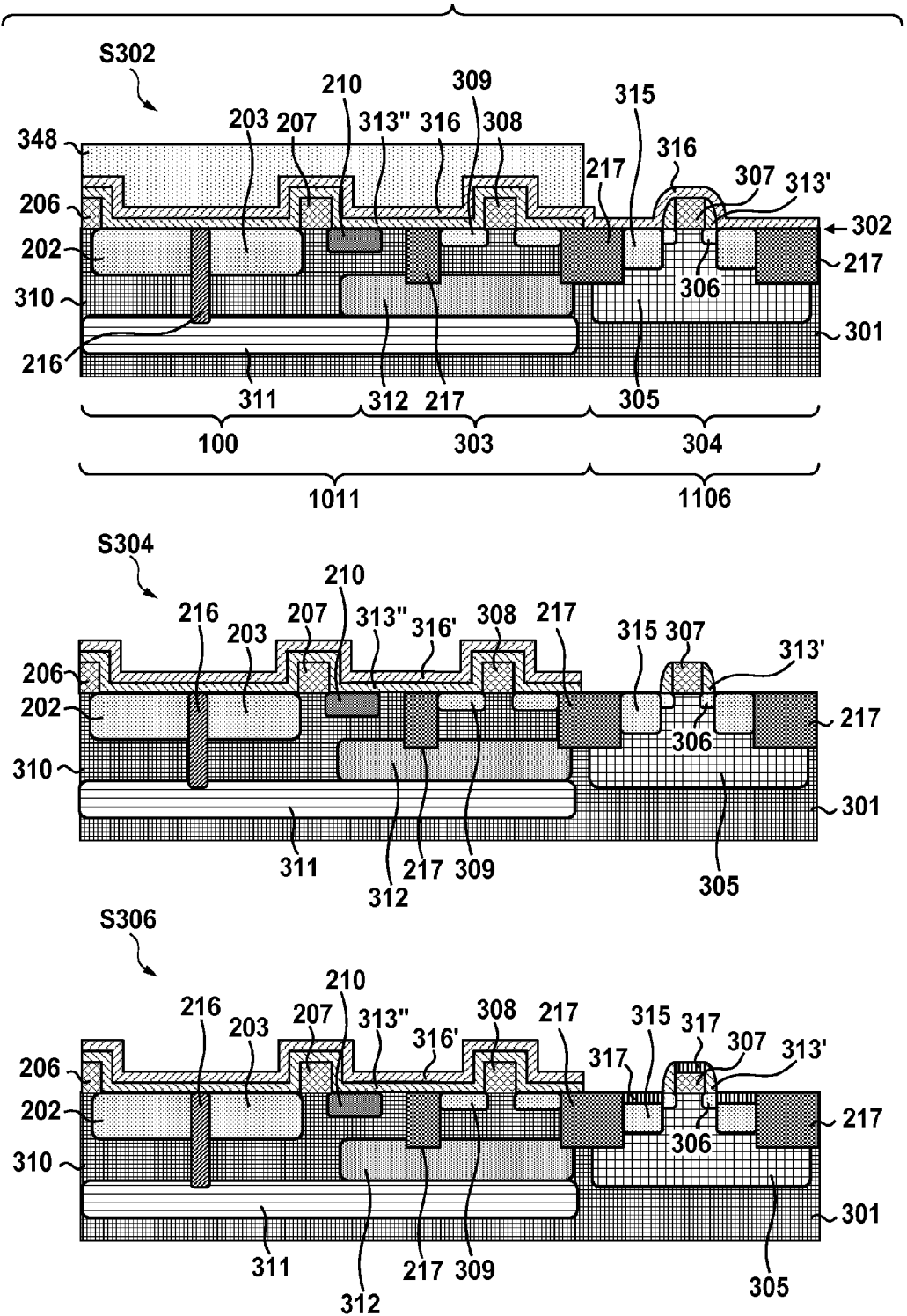
FIG. 3 shows views for exemplarily explaining a method of manufacturing the solid-state image sensor as one example of the semiconductor device.
Figure 4:
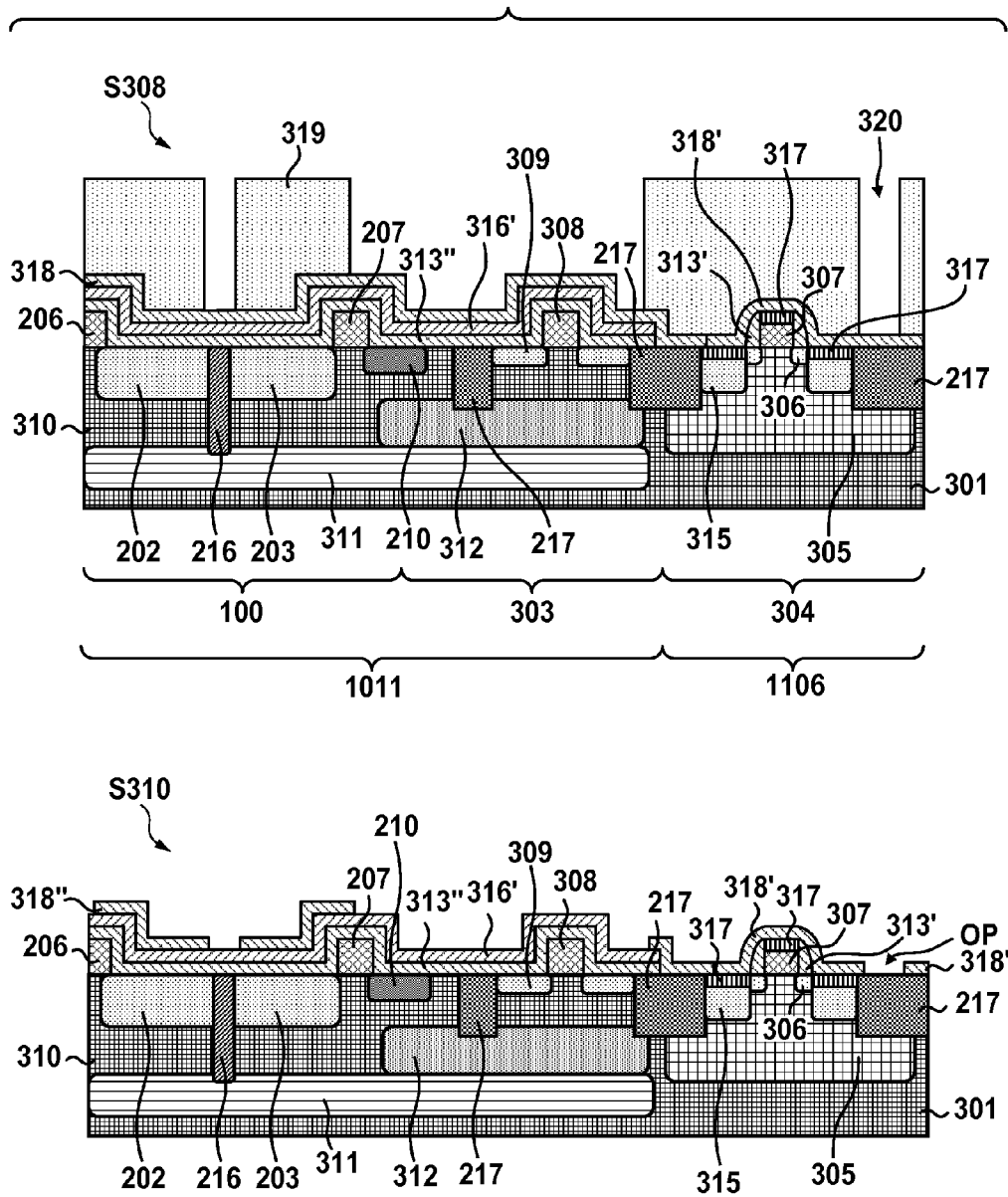
FIG. 4 shows views for exemplarily explaining the method of manufacturing the solid-state image sensor as one example of the semiconductor device.
Figure 6:
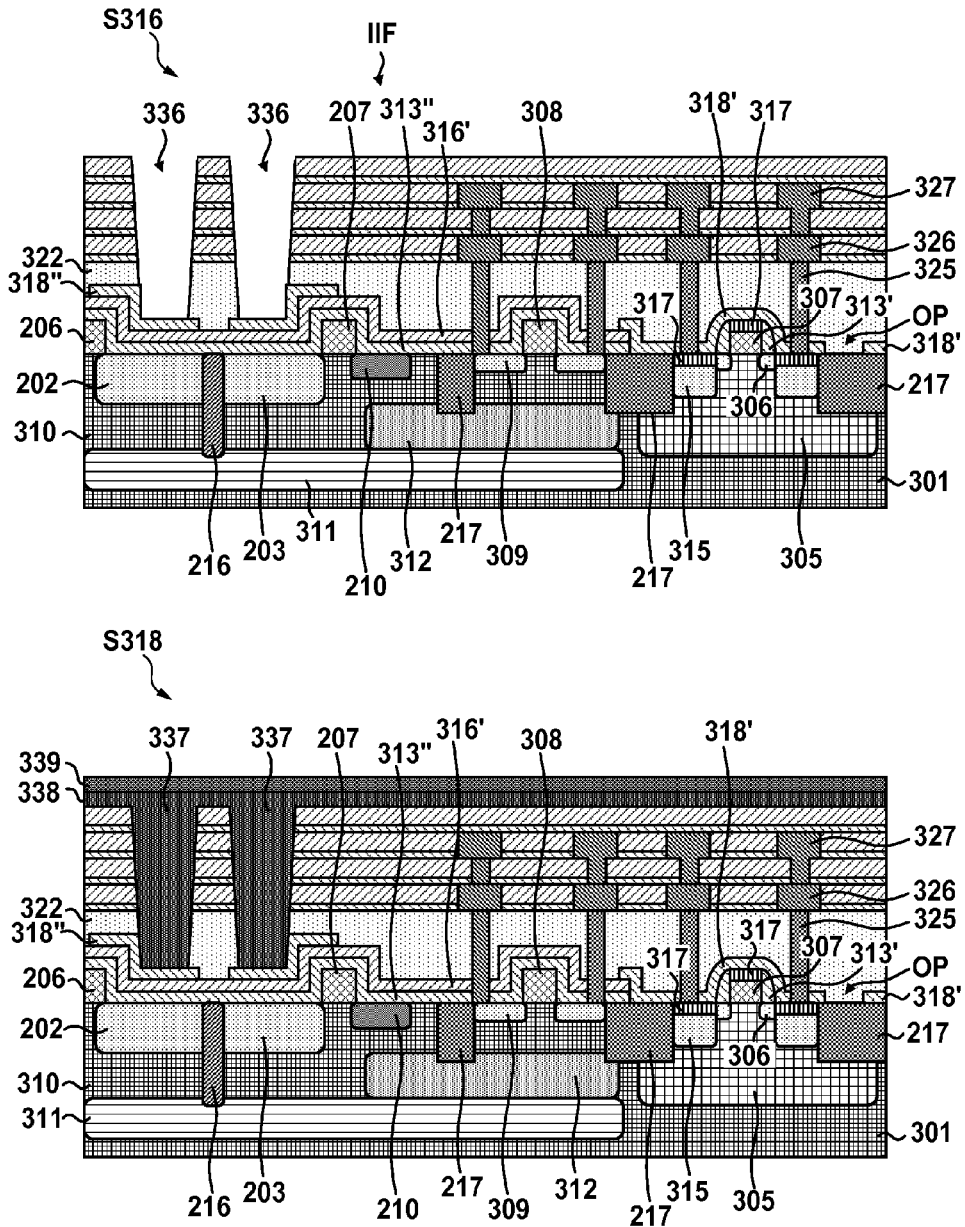
FIG. 6 shows views for exemplarily explaining the method of manufacturing the solid-state image sensor as one example of the semiconductor device.

FIG. 2 exemplifies the two-dimensional layout (plan view) of the unit pixel 100 in FIG. 1. Note that FIG. 2 is a view obtained by projecting the outer edge of each component on the major surface of a semiconductor substrate. FIG. 2 shows charge accumulating portions (n-type semiconductor regions) 201 to 204 which are parts of the first to fourth photoelectric converters 101 to 104. Gate electrodes 205 to 208 of the first to fourth transfer transistors are arranged in correspondence with the charge accumulating portions 201 to 204 of the first to fourth photoelectric converters. The drain of the first transfer transistor and the drain of the second transfer transistor form a first floating diffusion area (to be referred to as the first FD area hereinafter) 209. The drain of the third transfer transistor and the drain of the fourth transfer transistor form a second floating diffusion area (to be referred to as the second FD area hereinafter) 210.

A wiring 213 connects the first FD area 209, the second FD area 210, and a gate electrode 212 of the amplifier transistor. The gate electrode 212 of the amplifier transistor and the wiring 213 are integrated. A shared contact 214 connects the first FD area 209 and the wiring 213, and a shared contact 215 connects the second FD area 210 and the wiring 213. Each shared contact is a contact which connects the semiconductor regions, the semiconductor regions and the gate electrodes, or the gate electrodes without intervening a wiring layer. Furthermore, in FIG. 2, the second FD area 210 is the common region to the source or drain of the reset transistor. The unit pixel 100 includes a gate electrode 211 of the reset transistor.

Referring to FIG. 2, a region where a region to be the photoelectric converters, the sources and drains of the transistors, and the channels is formed is an active region, and the remaining region is an element isolating region 217. The element isolating region 217 includes an element isolating portion made of an insulator such as silicon oxide. In the active region, potential barriers 216 are arranged between the photoelectric converters, and the gate electrodes of the transfer transistors. Each potential barrier 216 is formed by the semiconductor region, and prevents charges from transfer between the photoelectric converters.

FIG. 13 exemplifies insulating films 701 to 704 used as etching stoppers when forming a waveguide in the pixel portion. FIG. 13 shows a pixel cell 100a and a part of a pixel cell 100b adjacent to it. Note that each of the pixel cells 100a and 100b corresponds to the pixel cell 100 illustrated in FIG. 1. The insulating film 701 corresponds to the charge accumulating portion 201, the insulating film 702 corresponds to the charge accumulating portion 202, the insulating film 703 corresponds to the charge accumulating portion 203, and the insulating film 704 corresponds to the charge accumulating portion 204. Each of the insulating films 701 to 704 is, for example, a silicon compound layer containing nitrogen, preferably a silicon nitride layer (SiN film). The silicon compound layer containing nitrogen can also contain, in addition to nitrogen, at least one of hydrogen, oxygen, carbon, and fluorine, and further contain an inevitable impurity. As other examples of the silicon compound layer containing nitrogen, SiON and SiCN can be given. That is, the silicon compound layer containing nitrogen can contain at least one of SiN, SiON, and SiCN.

Each of the insulating films 701 to 704 has a two-dimensional area larger than each of the charge accumulating portions 201 to 204 and is arranged such that its outer edge does not overlap each of the charge accumulating portions 201 to 204 as much as possible. This is to prevent the charge accumulating portions 201 to 204 (photoelectric converters) from receiving damage such as etching damage when patterning the insulating films 701 to 704 by etching. In the example shown in FIG. 13, the insulating films 701 to 704 are arranged to overlap on the gate electrodes 205 to 208 of the transfer transistors and the wiring 213 of the adjacent pixel cell 100b. This is to prevent the gate electrodes 205 to 208 and the wiring 213 from damage when forming an opening for the waveguide using the insulating films 701 to 704 as the etching stoppers.

The insulating films 701 to 704 are arranged so as not to overlap a region where contacts 705 to 708 arranged on the gate electrodes 205 to 208 and the contacts of the other transistors are arranged. This facilitates formation of the contacts 705 to 708 and the contacts of the other transistors.

A method of manufacturing the solid state image sensor 1001 as one example of the semiconductor device will exemplarily be described below with reference to FIGS. 3 to 8. Each of FIGS. 3 to 8 shows the section of the pixel cell 100, the section of a transistor (for example, a reset transistor or an amplifier transistor) 303 in the pixel portion 1011, and the section of a transistor 304 in the peripheral circuit portion 1106 taken along an A-B line in FIG. 2. An area where the pixel portion 1011 is to be formed and an area where the pixel portion 1011 has been formed can be referred to as pixel areas. An area where the peripheral circuit portion 1106 is to be formed and an area where the peripheral circuit portion 1106 has been formed can be referred to as peripheral circuit areas.

First, in step S302, a substrate where elements are arranged is prepared. The substrate includes a semiconductor substrate 301. The semiconductor substrate 301 is made of silicon and has a major surface 302. The charge accumulating portions 202 and 203, the transistor 303 in the pixel portion 1011, the transistor 304 in the peripheral circuit portion 1106, and the like are formed in the semiconductor substrate 301. The transistor 303 in the pixel portion 1011 includes n-type source/drain regions 309 and a gate electrode 308. In addition to the gate electrode 308, a gate electrode 207 of the transfer transistor and a gate electrode 307 of the transistor 304 in the peripheral circuit portion 1106 can be made of polysilicon.

An n-type semiconductor region 310 is provided below the charge accumulating portions 202 and 203. This n-type semiconductor region 310 has an impurity concentration lower than that of each charge accumulating portion and forms parts of the photoelectric converters together with the charge accumulating portions. A p-type semiconductor region 311 which functions as other parts of the photoelectric converters is arranged below the n-type semiconductor region 310. A p-type semiconductor region 312 is arranged in the lower portion of the source/drain regions 309 of the transistor 303 and the second FD area 210. A transistor which forms a CMOS circuit is arranged in the peripheral circuit portion 1106. However, each of FIGS. 3 to 8 only shows the n-type transistor 304. The transistor 304 in the peripheral circuit portion 1106 includes n-type LDD (Lightly-Doped-Drain) regions 306, source/drain regions 315, and a gate electrode 307 arranged in a p-type semiconductor region 305. Note that a gate oxide film is omitted in each of FIGS. 3 to 8.

The transistor 304 in the peripheral circuit portion 1106 includes side spacers 313' on the side surfaces of the gate electrode 307. An insulating film 313" which protects the pixel portion 1011 from a plasma damage or metal contamination is provided for the pixel portion 1011. Each of the side spacers 313' and the insulating film 313" can be, for example, a laminated film made of two layers of a silicon oxide layer and the silicon nitride layer or a laminated film made of three layers of the silicon oxide layer, the silicon nitride layer, and the silicon oxide layer. However, each of them can include at least the silicon nitride layer. These films can be formed by etching films that have been formed by CVD (Chemical-Vapor-Deposition).

The source/drain regions 315 of the transistor 304 in the peripheral circuit portion 1106 are $N^+$-type diffusion layers. The insulating film 313" in the pixel portion 1011 and the transistor 304 in the peripheral circuit portion 1106 are covered with an insulating film 316. The insulating film 316 can be made of the silicon oxide layer. The insulating film 316 can be formed by CVD.

Next, in step S302, a photoresist pattern 348 covers a region, out of the surface of the substrate having the above-described arrangement, where no silicide layer is to be formed in the subsequent steps. Note that the source/drain regions 315 and the gate electrode 307 of the transistor 304 in the peripheral circuit portion 1106 are regions where the silicide layer is formed, and thus the peripheral circuit portion 1106 is not covered with the photoresist pattern 348.

Then, in step S304, the insulating film 316 is etched (patterned) using the photoresist pattern 348 as an etching mask, a patterned insulating film 316' is formed, and then the photoresist pattern 348 is removed.

Then, in step S306, the source/drain regions 315 (silicon) and the gate electrode 307 (polysilicon) of the transistor 304 in the peripheral circuit portion 1106 are silicided to form silicide layers 317. Each silicide layer 317 is formed by, for example, a cobalt silicide. The silicide layers 317 can be formed by, for example, the following method. First, a metal film made of cobalt or the like is formed to cover the source/drain regions 315 and the gate electrode 307 of the transistor 304 in the peripheral circuit portion 1106. Next, silicon and polysilicon and a metal are made to react with each other by performing an annealing process at a temperature of about 400 to 600° C. Then, the unreacted metal is removed by etching. After that, an annealing process is performed at a temperature of about 700 to 850° C. Note that while the silicide layers 317 are formed in a region where silicon and polysilicon contact the metal film, no silicide layer is formed in a region where the insulating film 313" and/or the insulating film 316' and the metal film contact with each other. Therefore, no silicide layer is formed on the surfaces of the side spacers 313' and the insulating film 316'.

Next, in step S308, a silicon compound layer 318 is formed to cover the insulating film 316' in the pixel portion 1011 and the peripheral circuit portion 1106. The silicon compound layer 318 is a silicon compound layer containing nitrogen, preferably a silicon nitride layer. The silicon compound layer 318 can be formed by CVD. Note that an insulating film made of the silicon oxide layer may be formed before forming the silicon compound layer 318.

Then, in step S308, a photoresist pattern 319 is formed. The photoresist pattern 319 at least has an opening 320 in the peripheral circuit portion 1106. In addition, the photoresist pattern 319 can have an opening to expose the region of the transistor 303 in the pixel portion 1011.

Then, in step S310, the silicon compound layer 318 is etched (patterned) using the photoresist pattern 319 as an etching mask. By doing so, a patterned silicon compound layer 318' and a patterned silicon compound layer 318" are formed. The silicon compound layer 318' is a film, out of the silicon compound layer 318, selectively left in the peripheral circuit portion 1106 and has an opening OP. The silicon compound layer 318' can be used as an etching stopper when forming a contact hole in the peripheral circuit portion 1106. The opening OP provides a path through which hydrogen is supplied to the transistor 304. The opening OP is preferably formed to lie within the region of the element isolating portion 217 in a planar view with respect to the surface of the semiconductor substrate. That is, the opening OP can be formed inside an area within the silicon compound layer 318' that overlaps the element isolating portion 217. On the other hand, the opening OP is not preferably formed inside an area within the silicon compound layer 318' that does not overlap the element isolating portion 217, that is outside the area that overlaps the element isolating portion 217. This aims at acting no etching damage on the active region of the peripheral circuit portion 1106. In this step S310, it is preferable not to provide the opening in the area within the silicon compound layer 318 that does not overlap the element isolating portion 217.

The silicon compound layer 318" is a film, out of the silicon compound layer 318, selectively left in the pixel portion 1011 and can be used as an etching stopper when forming an opening to form a waveguide. The silicon compound layer 318" is preferably not arranged above the transistor 303 in the pixel portion 1011. This is because the insulating film 313" containing nitrogen as the silicon compound layer 318" exists above the transistor 303, and if both of the insulating film 313" and the silicon compound layer 318" exist, the formation step of the contact hole becomes complicated.

Then, in step S312, an interlayer insulating film 322 is formed to cover the silicon compound layers 318" and 316' in the pixel portion 1011, and the silicon compound layer 318' in the peripheral circuit portion 1106. The interlayer insulating film 322 is formed to cover the opening OP in the peripheral circuit portion 1106. The interlayer insulating film 322 can be a single-layer film or laminated film of silicate glass and/or silicon oxide-based materials. The interlayer insulating film 322 can be, for example, a laminated film made of a silicon oxide layer formed by atmospheric pressure CVD and a silicon oxide layer formed on the silicon oxide layer by plasma CVD. Next, the surface of the interlayer insulating film 322 is planarized using a known planarization technique such as CMP (Chemical-Mechanical-Polishing). Then, a photoresist film having a contact hole pattern (not shown) is formed. The interlayer insulating film 322, the insulating film 316', the insulating film 313", and the silicon compound layer 318' are etched using the formed photoresist film as a mask. By doing so, contact holes 323 in the peripheral circuit portion 1106 and contact holes 324 in the pixel portion 1011 are formed.

The silicon compound layer 318' functions as an etching stopper when forming the contact holes 323. The insulating film 313" also functions as an etching stopper when forming the contact holes 324. That is, when forming the contact holes, etching is performed on condition that the etching rate of the interlayer insulating film 322 (silicon oxide layer) is higher than the etching rate of each of the insulating films 313" and 318' (the silicon compound layers containing nitrogen). This etching stops at a time when the insulating film 313" and the silicon compound layer 318' are exposed. After that, the insulating films 313" and 318' are etched via the contact holes 324 and 323 by changing etching conditions. Such a formation method of the contact holes can reduce damage to the semiconductor substrate 301. Note that the silicon compound layer 318' is etched to expose the silicide layers 317.

Then, in step S314, contact plugs 325 are formed in the contact holes 323 and 324. Each contact plug 325 penetrates through the silicon compound layer 318' and is connected to the silicide layer 317. Each contact plug 325 is mainly formed from tungsten, and can include a barrier metal formed by a laminated film made of titanium and titanium nitride outside. Next, first wiring layers 326, second wiring layers 327 each including a via, and an interlayer film IIF made of a plurality of insulating films are formed. The first wiring layers 326 and the second wiring layers 327 formed integrally with the via mainly contain copper. Each first wiring layer 326 can have a structure formed by a single damascene method. Each second wiring layer 327 can have a structure formed by a dual damascene method, that is, a structure in which the via and the wiring layer are formed by an integrated electrical conductor. Each of the via and the wiring layer can include a barrier metal. Note that the first and second wiring layers may be formed not by the damascene methods but by normal patterning.

The insulating films which form the interlayer film IIF can be, for example, a silicon nitride layer 328, a silicon oxide layer 329, a silicon nitride layer 330, a silicon oxide layer 331, a silicon nitride layer 332, a silicon oxide layer 333, a silicon nitride layer 334, and a silicon oxide layer 335 in order from the lowest layer. Each silicon oxide layer can be formed, by the plasma CVD method, to have the thickness of about 120 nm to 1,000 nm. Each silicon nitride layer can be formed, by the plasma CVD method, to have the thickness of about 10 nm to 200 nm. Therefore, the most part of the interlayer film IIF is made of the silicon oxide layers. Each of the silicon nitride layers 328, 330, 332, and 334 can function as an etching stopper when forming the wiring layers and vias and a diffusion preventing film which prevents metal diffusion.

Next, in step S316, openings 336 for waveguides are formed in the interlayer film IIF and the interlayer insulating film 322. More specifically, photoresist patterns having openings in regions corresponding to the charge accumulating portions 202 and 203 (photoelectric converters) are formed above the interlayer film IIF. The interlayer film IIF and the interlayer insulating film 322 are etched using the formed photoresist patterns as masks. This etching can be anisotropic etching such as plasma etching. This etching is performed until the silicon compound layer 318" is exposed. Note that the silicon compound layer 318" is a film for reducing a plasma damage to the charge accumulating portions 202 and 203 (photoelectric converters) in etching, and also functions as an etching stopper. Each of an insulating film (not shown) made of silicon oxide between the major surface 302 of the semiconductor substrate, the insulating film 313", and the insulating film 316' functions as an antireflection film against light that should enter the semiconductor substrate.

Then, in step S318, each opening 336 is filled with a transparent material having a refractive index higher than that of each insulating film which forms the interlayer film IIF, thereby forming the core of the waveguide. For example, each opening 336 is filled with silicon nitride having a refractive index higher than that of silicon oxide which is a main material forming the interlayer film IIF, thereby forming the core of the waveguide. More specifically, the core of the waveguide is formed to cover inside each opening 336 and the surface of the interlayer film IIF by a High Density Plasma-CVD method. Then, silicon nitride in a portion other than the inside of the openings 336 is removed by CMP (Chemical Mechanical Polishing) or plasma etching. By this removing step, each insulator 337 serving as a member having a high refractive index which forms the core remains in the opening 336. The interlayer film IIF functions as the cladding of each waveguide.

Note that in the removal and the planarization of silicon nitride to form the cores, all silicon nitride is not removed from the interlayer film IIF but an insulating film 338 made of silicon nitride may be left on the interlayer film IIF. The thickness of the insulating film 338 which extends from above the insulators 337 to the upper surface of the interlayer film IIF can be a layer of about 100 nm to 500 nm. This is advantageous in suppressing damage to the wiring layers. An insulating film 339 made of silicon oxynitride can be formed on the insulating film 338. The insulating film 339 can be formed, by the plasma CVD method, to have a thickness of about 50 nm to 150 nm.

Then, in step S320, the insulating film 338 and the insulating film 339 are patterned to form patterned insulating film 338' and insulating film 339'. For example, the portion above a transistor such as the transistor 303 in the pixel portion 1011 and the portion above the peripheral circuit portion 1106 can be removed from the insulating film 338 and the insulating film 339. This is advantageous in preventing warping of the substrate or occurrence of film peeling caused by stresses of the insulating film 338 and the insulating film 339. Furthermore, etching in the subsequent steps is facilitated easier by removing the insulating film 338 and the insulating film 339 in the regions where the vias are formed.

Then, in step S322, an insulating film 341 is formed to cover the insulating film 338', the insulating film 339', and the exposed interlayer film IIF. The insulating film 341 is made of, for example, silicon oxide and can be formed by the plasma CVD method. Next, a part of the insulating film 341 is opened to form a via 342 which is connected to the second wiring layer 327. The via 342 is formed from, for example, tungsten and can contain a barrier metal made of titanium and titanium nitride. Then, a third wiring layer 343 is formed on the via 342. For example, each third wiring layer 343 is made of an electrical conductor which mainly contains aluminum and can be formed by patterning. Each third wiring layer 343 can also function as a light-shielding film.

Then, in step S324, an insulating film 344 and an insulating film 345 are formed in this order. The insulating film 344 can be silicon oxynitride formed by the plasma CVD method and the insulating film 345 can be silicon nitride formed by the plasma CVD method. Next, a photoresist having a lens shape is formed on the insulating film 345 and etching is performed using the formed photoresist as a mask, thereby transferring the lens shape to the insulating film 345. After that, an insulating film 346 is formed on the insulating film having the lens shape. The insulating film 346 can be silicon oxynitride formed by the plasma CVD method. Then, three layers of the insulating films 344, 345, and 346 in a region corresponding to an external electrode pad are removed. Note that the insulating film 345 can be a lens layer including interlayer lenses 347, and each of the insulating film 344 and the insulating film 346 can function as an antireflection film to the insulating film 345.

After step S324, a planarizing layer made of a resin, a color filter layer including color filters corresponding to a plurality of colors, and a microlens layer including a microlens can be formed in this order. Note that the color filters may not be formed for a three-chip or monochrome solid-state image sensor.

Figure 8:
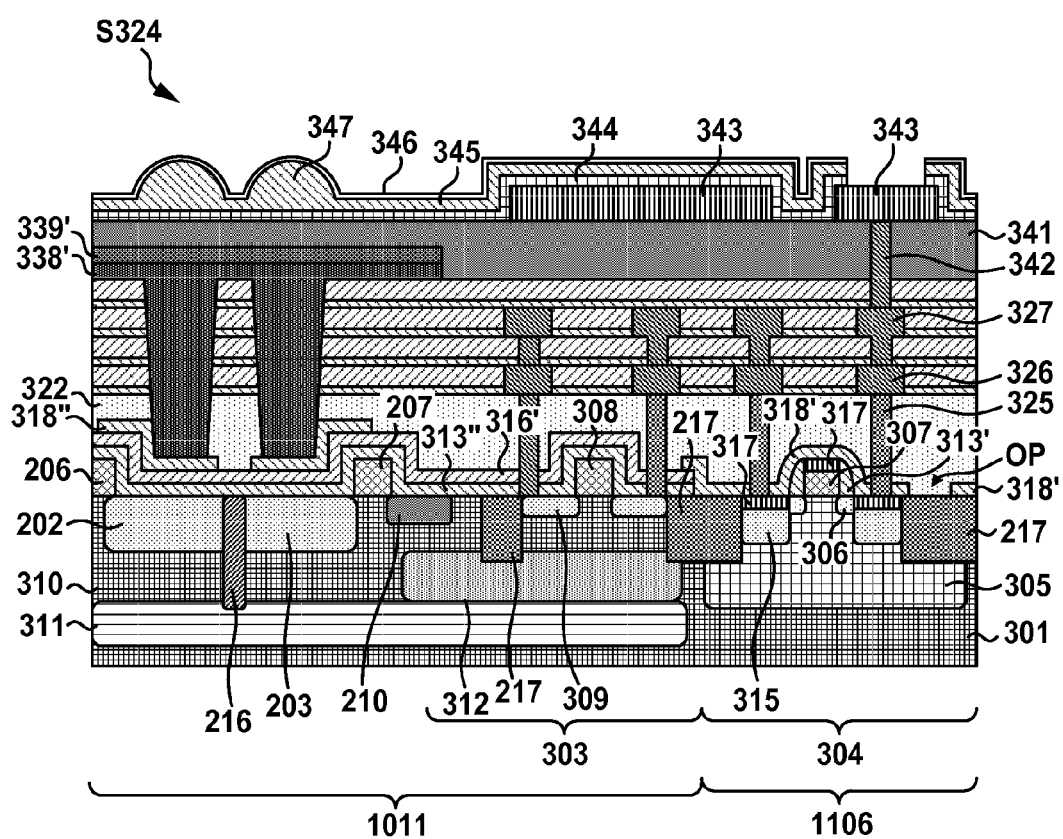
FIG. 8 is a view for exemplarily explaining the method of manufacturing the solid-state image sensor as one example of the semiconductor device.
Figure 9:
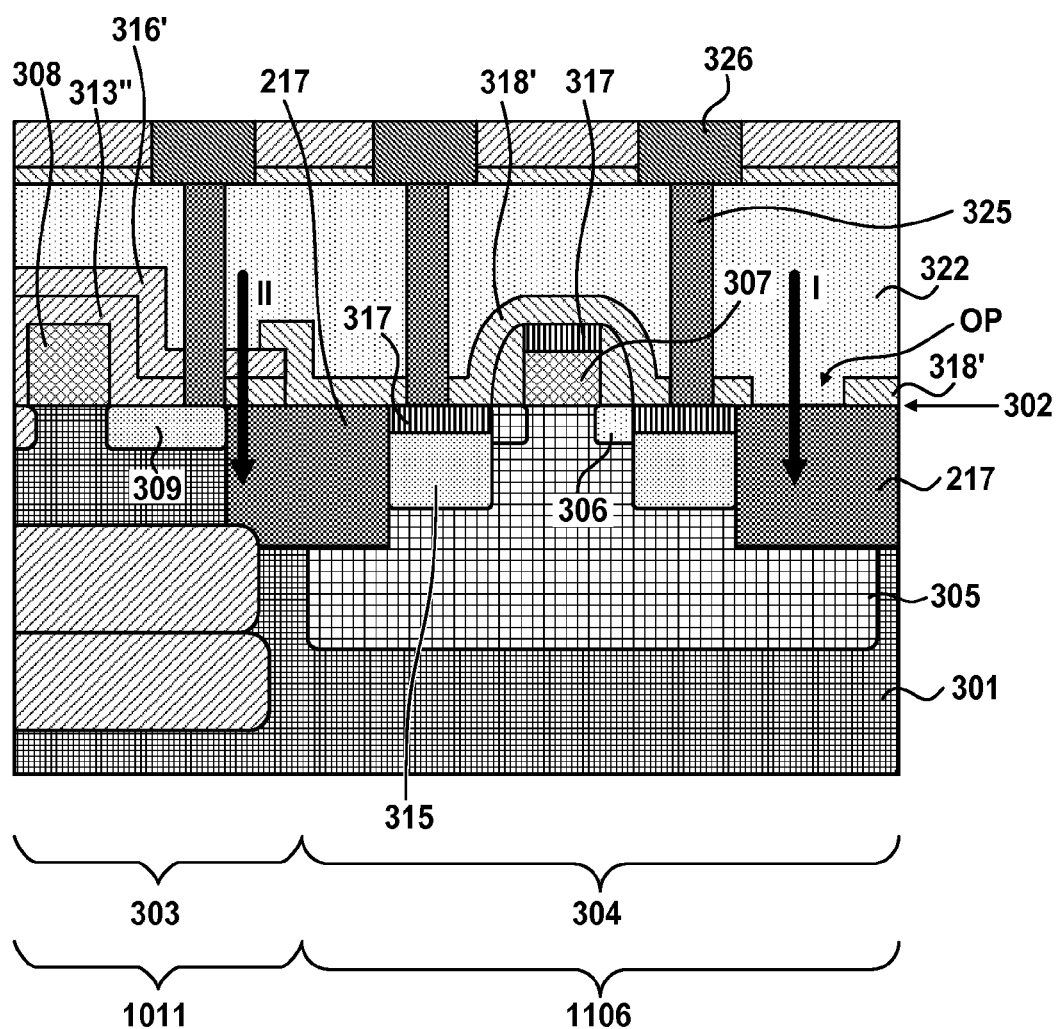
FIG. 9 is a partially enlarged view of a sectional view for explaining step S324 in FIG. 8.

FIG. 9 is a partially enlarged view of the sectional view for explaining step S324 in FIG. 8. Reference symbols I and II indicate hydrogen supply paths to the semiconductor substrate 301. The neighborhood of the major surface 302 of the semiconductor substrate 301 is a region where a dangling bond exists which may have an influence on the subthreshold characteristic or mobility of each transistor. The silicon compound layer 318' (for example, silicon nitride layer), and the silicon nitride layer 328 and 330 containing nitride are films formed after forming the silicide layers 317. Therefore, an annealing process at a high temperature of 900° C. or higher should not be applied to the silicon compound layer 318' and the silicon nitride layers 328 and 330 from the viewpoint of protecting the silicide layers 317. That is, the substrate should not be processed at the temperature of 900° C. or higher after forming the silicide layers 317. As a result, the hydrogen permeability of each of the films 318', 328, and 330 is kept low, and thus a sufficient amount of hydrogen is not supplied to the semiconductor substrate 301. To cope with this, in this embodiment, the opening OP through which hydrogen is supplied from the interlayer insulating film 322 to the semiconductor substrate 301 is provided in the silicon compound layer 318'.

Hydrogen which exists in the interlayer insulating film 322 can include hydrogen supplied from the silicon compound layer 318' or 328 serving as the supply source of hydrogen into the interlayer insulating film 322. An annealing process is needed for the diffusion of hydrogen. For example, an annealing process at a temperature of about 400° C. such as sintering which is performed in the final stage of a process will suffice. As described above, the supply path I of hydrogen is obtained by formation of the opening OP, thereby increasing the termination rate of the dangling bond of the transistor 304 which forms the peripheral circuit portion 1106. This improves the subthreshold characteristic, mobility, or the like of the transistor which forms the peripheral circuit portion 1106.

On the other hand, the insulating film 313" (including an insulating film containing silicon and nitrogen) is formed in the pixel portion 1011 to cover its entire region. This protects the entire region of the pixel portion 1011 from a plasma damage or metal contamination. Note that it is possible to apply the annealing process at the temperature of 900° C. or higher to the insulating film 313" as needed by forming the insulating film 313" prior to the formation step of the silicide layer. By this annealing process, the hydrogen permeability of the insulating film 313" can be increased. It is therefore possible, without forming the opening in the insulating film 313", to secure the path II where hydrogen is supplied from the interlayer insulating film 322 to each element which forms the pixel portion 1011 via the insulating film 313". This makes it possible to achieve, in the pixel portion 1011, both of protection from the plasma damage or metal contamination and the increase in the termination rate of the dangling bond by hydrogen supply, and to suppress noise from occurring in the pixel portion 1011.

Figure 10:
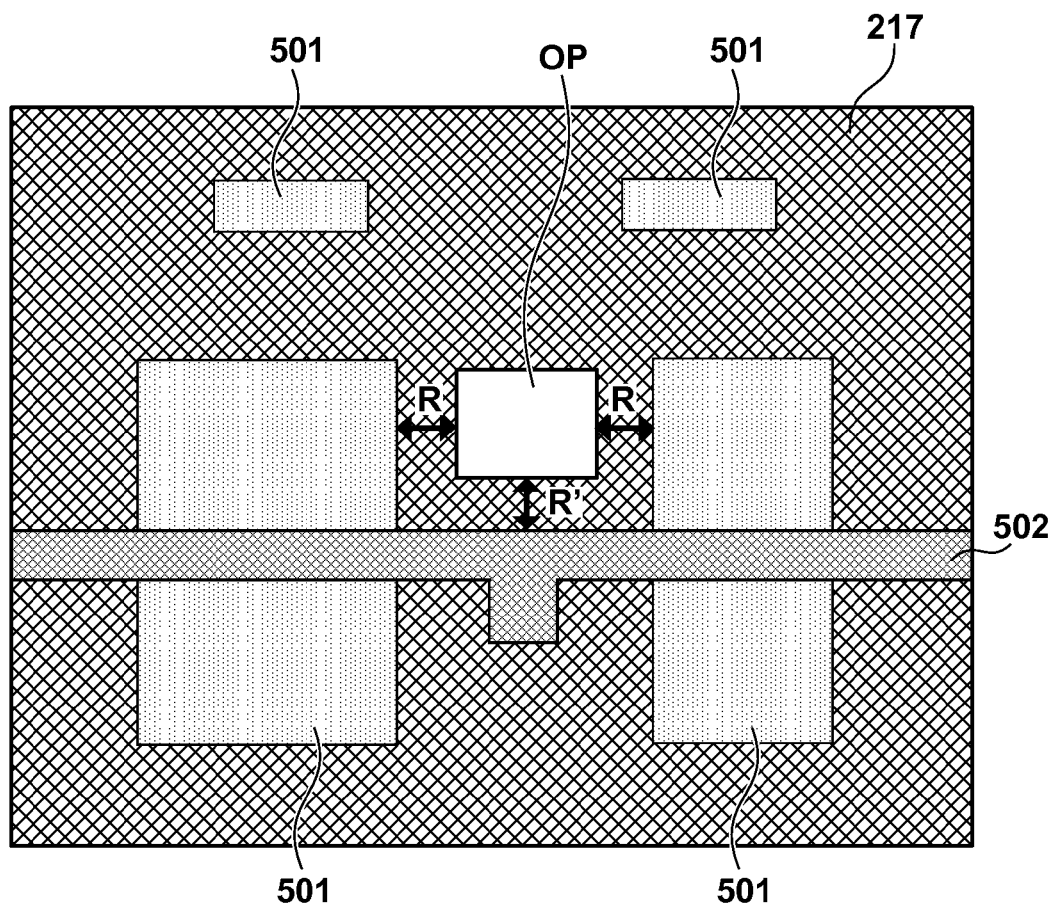
FIG. 10 is a view showing the first preferable arrangement example of an opening in a peripheral circuit portion.

The first preferable arrangement example of the opening OP in the peripheral circuit portion 1106 will be described with reference to FIG. 10. FIG. 10 shows the element isolating portion 217, active regions 501, gate electrode 502, and the opening OP. The opening OP is preferably arranged to lie within the region of the element isolating portion 217, that is, not to lie beyond the active regions 501 in a planar view with respect to the surface of the semiconductor substrate. In other words, the opening OP is formed within the silicon compound layer 318 or an area that overlaps the element isolating portion 217, and does not lie beyond the area that overlaps the element isolating portion 217. The opening OP can be arranged with a distance R away from the outer edge of each active region 501. This makes it possible to prevent each active region 501 from etching damage when forming the opening OP. Furthermore, the opening OP does not exist on the gate electrode 502 but can be arranged with a distance R' away from the gate electrode 502. This makes it possible to prevent the gate electrode 502 and a gate insulating film from etching damage when forming the opening OP. The distances R and R' can be determined in accordance with the overlay accuracy of an exposure apparatus used to form a photoresist pattern for forming the opening OP. The distance R can take a value of about, for example, 0.05 to 0.20 µm.

The second preferable arrangement example of the openings OP in the peripheral circuit portion 1106 will be described with reference to FIG. 11. FIG. 11 shows the element isolating portion 217, active regions 601, a gate electrode 602, and the openings OP. The openings OP are preferably arranged to lie within the region of the element isolating portion 217, that is, not to lie beyond the active regions 601 in a planar view with respect to the surface of the semiconductor substrate. The distances R and R' can follow the first arrangement example. In the second arrangement example, the plurality of openings OP are arranged two-dimensionally in a range which satisfies constraints on the distances R and R'.

Figure 12:
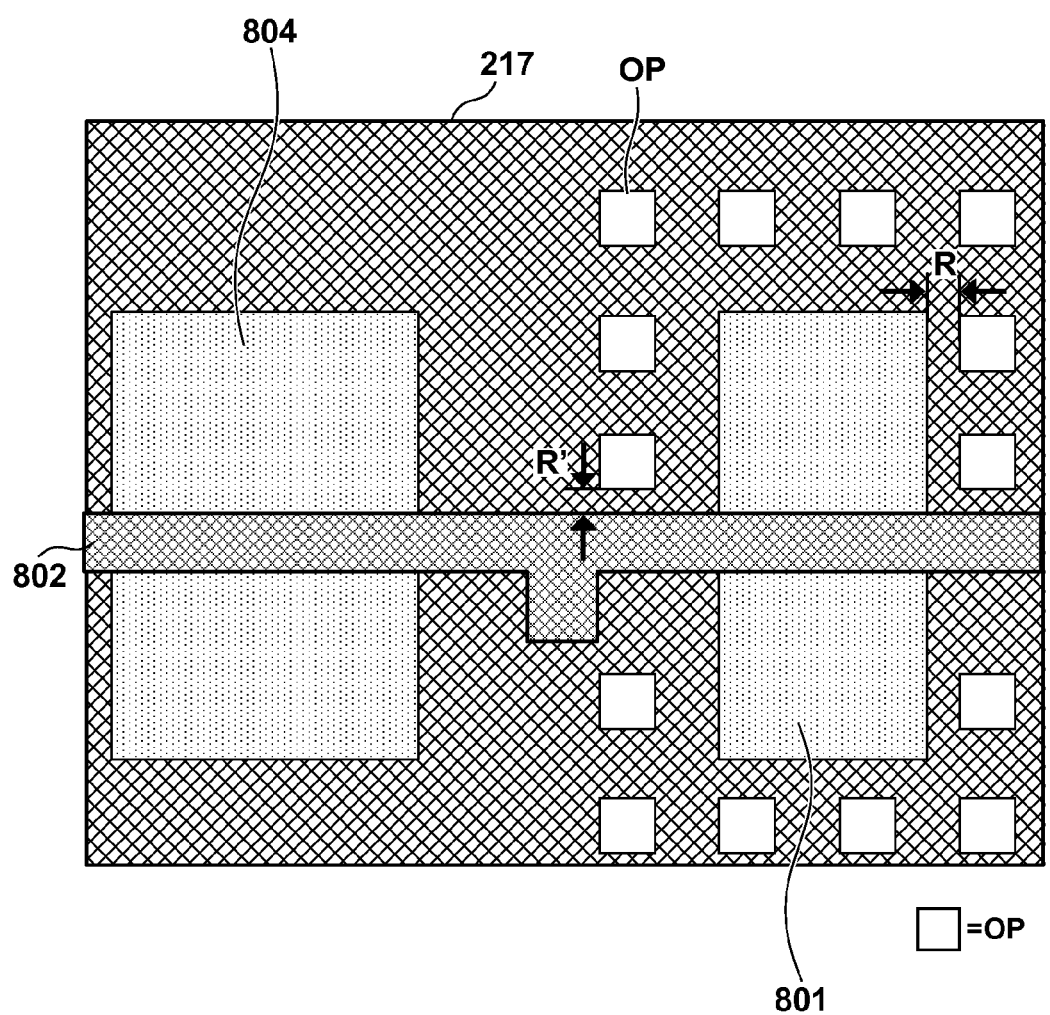
FIG. 12 is a view showing the third preferable arrangement example of the openings in the peripheral circuit portion.

The third preferable arrangement example of the openings OP in the peripheral circuit portion 1106 will be described with reference to FIG. 12. FIG. 12 shows the element isolating portion 217, an active region 801 for the NMOS transistor, an active region 804 for the PMOS transistor, a gate electrode 802, and the openings OP. Note that the active region 801 for the NMOS transistor forms the source/drain regions of the NMOS transistor, and the active region 804 for the PMOS transistor forms the source/drain regions of the PMOS transistor. The openings OP are arranged in the active region 801 for the NMOS transistor, that is, in the periphery of the source/drain regions of the NMOS transistor. On the other hand, the openings OP are not arranged in the active region 804 for the PMOS transistor, that is, in the periphery of the source/drain regions of the PMOS transistor. The distances R and R' can follow the first arrangement example.

The third arrangement example may be effective for NBTI unique to the PMOS transistor. NBTI is related to a gate oxide film and hydrogen which exists in its interface. If the amount of hydrogen contained is large, the influence of NBTI may become large. Therefore, it might be more effective to form the openings OP only around the NMOS transistor and suppress the supply amount of hydrogen to the PMOS transistor.

Figure 14:
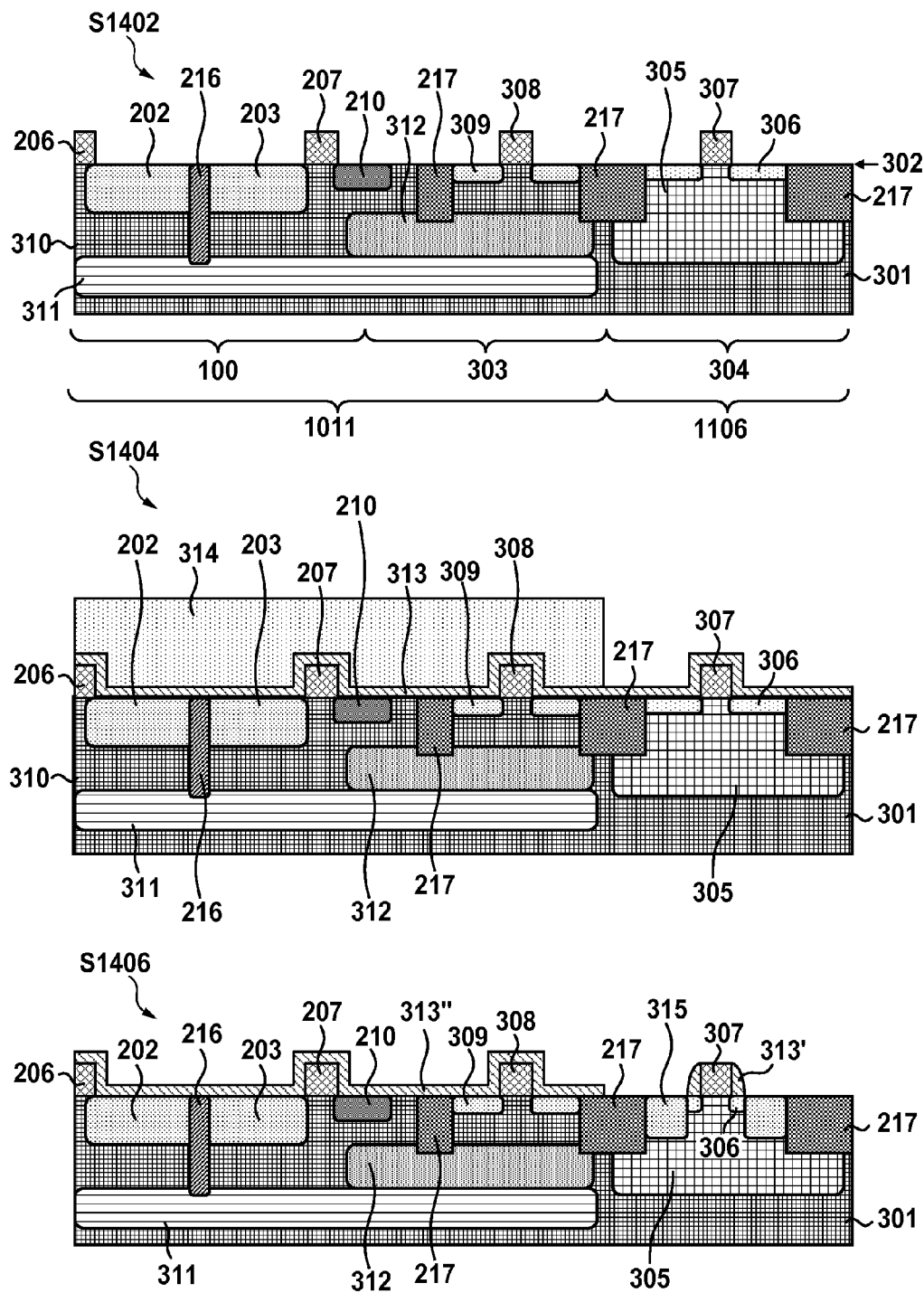
FIG. 14 shows views for exemplarily explaining steps that can be performed before steps shown in FIGS. 3 to 8.

FIG. 14 exemplarily shows steps that can be performed before steps shown in FIGS. 3 to 8. FIG. 14 shows the section of the pixel cell 100, the section of the transistor (for example, the reset transistor or the amplifier transistor) 303 in the pixel portion 1011, and the section of the transistor 304 in the peripheral circuit portion 1106 taken along an A-B line in FIG. 2.

First, in step S1402, the substrate where elements are arranged is prepared. The substrate includes the semiconductor substrate 301. The semiconductor substrate 301 is made of silicon and has the major surface 302. The charge accumulating portions 202 and 203, the transistor 303 in the pixel portion 1011, the transistor 304 in the peripheral circuit portion 1106, and the like are formed in the semiconductor substrate 301. The transistor 303 in the pixel portion 1011 includes the n-type source/drain regions 309 and the gate electrode 308. In addition to the gate electrode 308, the gate electrode 207 of the transfer transistor and the gate electrode 307 of the transistor 304 in the peripheral circuit portion 1106 can be made of polysilicon.

The n-type semiconductor region 310 is provided below the charge accumulating portions 202 and 203. This n-type semiconductor region 310 has the impurity concentration lower than that of each charge accumulating portion and forms the parts of the photoelectric converters together with the charge accumulating portions. The p-type semiconductor region 311 which functions as the other parts of the photoelectric converters is arranged below the n-type semiconductor region 310. The p-type semiconductor region 312 is arranged in the lower portion of the source/drain regions 309 of the transistor 303 and the second FD area 210. The transistor which forms a CMOS circuit is arranged in the peripheral circuit portion 1106. However, each of FIGS. 3 to 8 only shows the n-type transistor 304. The transistor 304 in the peripheral circuit portion 1106 includes the n-type LDD (Lightly-Doped-Drain) regions 306, the source/drain regions 315, and the gate electrode 307 arranged in the p-type semiconductor region 305. Note that the gate oxide film is omitted in each of FIGS. 3 to 8.

In step S1404, the insulating film (second insulating film) 313 is formed on the semiconductor substrate 301. The insulating film 313 can be, for example, the laminated film made of two layers of a silicon oxide layer and the silicon nitride layer or the laminated film made of three layers of the silicon oxide layer, the silicon nitride layer, and the silicon oxide layer. However, the insulating film 313 can include at least the silicon nitride layer. These films can be formed by CVD. Then, the photoresist pattern 314 is formed to cover the pixel portion 1011.

In step S1406, anisotropic etching is performed on the insulating film 313 using the photoresist pattern 314 as a mask. Since the pixel portion 1011 is covered with the photoresist pattern 314, the patterned insulating film 313" remains. On the other hand, since the peripheral circuit portion 1106 is not covered with the photoresist pattern 314, the side spacers 313' are formed on the side surfaces of the gate electrode 307 by etching the insulating film 313. The insulating film 313" has a function of protecting the pixel portion 1011 from the plasma damage or metal contamination. Then, a photoresist pattern (not shown) is formed and the source/drain regions 315 are formed by ion implantation.

Then, the annealing process is performed on the semiconductor substrate 301, thereby activating the ions that have been implanted into the source/drain regions 315. The temperature for this annealing process can be set to a temperature within a range of, for example, 900° C. to about 1,000° C. This annealing process can increase the hydrogen permeability of the insulating film 313". Therefore, hydrogen which exists in the interlayer insulating film 322 can transmit through the insulating film 313" and be supplied to the pixel portion 1011. This makes it possible to terminate the dangling bond which exists in the pixel portion 1011. The subsequent steps can be the same as steps shown in FIGS. 3 to 8. Note that the highest temperature in a process after forming the silicide layers 317 is lower than that in the annealing process for activating the ions that have been implanted into the source/drain regions 315 (that is, the annealing process after forming the insulating film 313" and the side spacers 313').

Note that if an opening is formed in the insulating film 313", the plasma damage or metal contamination may be caused in the semiconductor substrate 301 via that opening. However, hydrogen is supplied to the semiconductor substrate 301 via the insulating film 313" by performing the annealing process on the insulating film 313", thus obviating the need for forming the opening in the insulating film 313". It is therefore possible to achieve, in the pixel portion 1011, both of protection from the plasma damage or metal contamination and the increase in the termination rate of the dangling bond by hydrogen supply. This makes it possible to suppress noise from occurring in the pixel portion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-087593, filed Apr. 21, 2014, which is hereby incorporated by reference herein in its entirety.

What is claimed is:

1. A method of manufacturing a semiconductor device, the method comprising:
   forming a silicon compound layer containing nitrogen on a substrate where a silicide layer and an element isolating portion have been formed;
   forming an opening in the silicon compound layer so that the opening is arranged over only the element isolating portion; and
   forming an interlayer insulating film which covers the silicon compound layer and the opening,
   wherein the interlayer insulating film contacts the element isolating portion.

2. The method according to claim 1, wherein the substrate includes a gate electrode, and
   wherein in the forming the opening, the opening is formed so as not to expose the gate electrode.

3. The method according to claim 1, further comprising:
   forming a contact hole in the interlayer insulating film by etching the interlayer insulating film using the silicon compound layer as an etching stopper; and
   etching the silicon compound layer so as to expose the silicide layer via the contact hole.

4. The method according to claim 1, wherein the semiconductor device includes a pixel area and a peripheral circuit area,
   wherein in the forming the silicon compound layer, the silicon compound layer is formed in the pixel area and the peripheral circuit area, and
   wherein in the forming the opening, the opening is formed in the peripheral circuit area.

5. The method according to claim 4, wherein in the forming the opening, the silicon compound layer in the pixel area is patterned together with formation of the opening.

6. The method according to claim 1, wherein the semiconductor device includes a pixel area and a peripheral circuit area,
   wherein in the forming the silicon compound layer, the silicon compound layer is formed in the pixel area and the peripheral circuit area, and
   wherein the method further comprises:
   forming a contact hole in the interlayer insulating film in the peripheral circuit area using the silicon compound layer as an etching stopper; and
   etching the silicon compound layer so as to expose the silicide layer via the contact hole.

7. The method according to claim 5, further comprising forming an opening to form a waveguide in the interlayer insulating film in the pixel area using the silicon compound layer as the etching stopper.

8. A method of manufacturing a semiconductor device, the method comprising:
   forming a first insulating film containing silicon and nitrogen on a substrate where an element isolating portion has been formed;
   performing an annealing process after forming the first insulating film;
   forming a silicide layer on the substrate;
   forming a silicon compound layer containing nitrogen on the substrate where the silicide layer and an element isolating portion have been formed;
   forming an opening in the silicon compound layer; and
   forming a second insulating film which covers the silicon compound layer and the opening,
   wherein a highest temperature in a process after forming the silicide layer is lower than a highest temperature in the annealing process.

9. A method of manufacturing a semiconductor device, the method comprising:
   forming a silicon compound layer containing nitrogen on a substrate where a silicide layer and an element isolating portion have been formed;
   forming an opening in the silicon compound layer; and
   forming an interlayer insulating film which covers the silicon compound layer and the opening,
   wherein the opening is formed to lie within an area of the silicon compound layer that overlaps the element isolating portion, and
   wherein hydrogen is supplied from the interlayer insulating film to the substrate via the opening.

10. The method according to claim 1, wherein the silicon compound layer contains at least one material selected from the group consisting of SiN, SiON, and SiCN.

11. A method of manufacturing a solid-state image sensor including a pixel area and a peripheral circuit area including a silicide layer, the method comprising:
    forming a silicon compound layer containing nitrogen on a substrate where the silicide layer has been formed;
    forming an opening in the silicon compound layer in the peripheral circuit area; and
    forming an interlayer insulating film which covers the silicon compound layer and the opening,
    wherein hydrogen is supplied from the interlayer insulating film to the substrate via the opening.

12. The method according to claim 11, wherein in the forming the opening, the silicon compound layer in the pixel area is patterned together with formation of the opening.

13. The method according to claim 11, further comprising:
    forming a contact hole in the interlayer insulating film in the peripheral circuit area using the silicon compound layer as an etching stopper, and
    etching the silicon compound layer so as to expose the silicide layer via the contact hole.

14. The method according to claim 12, further comprising forming an opening to form a waveguide in the interlayer insulating film in the pixel area using the silicon compound layer as the etching stopper.

15. A solid-state image sensor comprising:
    a semiconductor substrate;
    a silicide layer arranged on said semiconductor substrate;
    an element isolating portion;
    a silicon compound layer arranged on the silicide layer and containing nitrogen; and
    an interlayer insulating film arranged on the silicon compound layer,
    wherein the silicon compound layer has an opening arranged only on the element isolating portion, and
    wherein the interlayer insulating film is arranged so as to cover the silicon compound layer and the opening and to contact the element isolating portion.

16. The sensor according to claim 15, further comprising a contact plug penetrating through the interlayer insulating film and the silicon compound layer, and connected to the silicide layer.

17. The sensor according to claim 15, wherein the silicon compound layer is arranged on the on the element isolating portion, and
    wherein the opening lies within an area of said element isolating portion.

18. The sensor according to claim 15, further comprising:
    a pixel area and a peripheral circuit area;
    a first insulating film arranged between the semiconductor substrate and the interlayer insulating film in the pixel area, and containing silicon and nitrogen; and a second insulating film arranged between the first insulating film and the interlayer insulating film in the pixel area, and containing silicon and oxygen,
wherein the silicide layer is arranged in the peripheral circuit area.

19. The sensor according to claim 18, further comprising:
a third insulating film arranged on the second insulating film, and containing silicon and nitrogen; and
a waveguide arranged on the third insulating film.

20. A camera comprising;
a solid-state image sensor defined in claim 15; and
a processor configured to process a signal output from the solid-state image sensor.

\* \* \* \* \*